United States Patent
Kim et al.

(10) Patent No.: US 10,522,456 B2
(45) Date of Patent: Dec. 31, 2019

(54) CAPACITOR STRUCTURE AND SEMICONDUCTOR DEVICE INCLUDING THE SAME

(71) Applicant: SAMSUNG ELECTRONICS CO., LTD., Suwon-si, Gyeonggi-do (KR)

(72) Inventors: Jae-woo Kim, Bucheon-si (KR); Chul-ki Kim, Suwon-si (KR); Chul-wan Kim, Suwon-si (KR); Yu-kyung Park, Hwaseong-si (KR); Gil-heyun Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/957,048

(22) Filed: Apr. 19, 2018

(65) Prior Publication Data

US 2019/0051597 A1 Feb. 14, 2019

(30) Foreign Application Priority Data

Aug. 11, 2017 (KR) .................. 10-2017-0102570

(51) Int. Cl.
- *H01L 29/00* (2006.01)
- *H01L 23/522* (2006.01)
- *H01L 49/02* (2006.01)
- *H01L 23/528* (2006.01)

(52) U.S. Cl.
CPC ...... *H01L 23/5223* (2013.01); *H01L 23/5286* (2013.01); *H01L 28/88* (2013.01); *H01L 28/91* (2013.01)

(58) Field of Classification Search
CPC .................................................. H01L 23/5286
See application file for complete search history.

(56) References Cited

U.S. PATENT DOCUMENTS

| 7,713,815 | B2 | 5/2010 | Lehr et al. |
| 7,768,055 | B2 | 8/2010 | Chinthakindi et al. |
| 7,866,015 | B2 | 1/2011 | Chinthakindi |
| 2014/0225225 | A1 | 8/2014 | Chung |
| 2017/0025270 | A1* | 1/2017 | Singh .................. H01L 23/5223 |

FOREIGN PATENT DOCUMENTS

| KR | 10-0695989 B1 | 3/2007 |
| KR | 10-0695993 B1 | 3/2007 |
| KR | 10-2014-0101503 A | 8/2014 |
| KR | 10-1464710 B1 | 11/2014 |

\* cited by examiner

*Primary Examiner* — Samuel A Gebremariam
(74) *Attorney, Agent, or Firm* — Lee & Morse, P.C.

(57) ABSTRACT

A capacitor structure includes a substrate including an electrode pad and a ground pad, a plurality of dielectric layers on the substrate, the plurality of dielectric layers being at different levels on the substrate, a plurality of conductive pattern layers in at least two dielectric layers of the plurality of dielectric layers, the at least two dielectric layers of the plurality of dielectric layers being first dielectric layers, a plurality of via plugs connecting the plurality of conductive pattern layers to each other, and at least one contact layer in at least one second dielectric layer of the plurality of dielectric layers, the at least one second dielectric layer being different from the at least two first dielectric layers, and the at least one contact layer electrically connecting the plurality of conductive pattern layers to the electrode pad and the ground pad.

20 Claims, 17 Drawing Sheets

CAPACITOR STRUCTURE AND SEMICONDUCTOR DEVICE INCLUDING THE SAME

CROSS-REFERENCE TO RELATED APPLICATION

Korean Patent Application No. 10-2017-0102570, filed on Aug. 11, 2017, in the Korean Intellectual Property Office, and entitled: "Capacitor Structure and Semiconductor Device Including the Same," is incorporated by reference herein in its entirety.

BACKGROUND

1. Field

Embodiments relate to a capacitor structure and a semiconductor device including the same, and more particularly, to a vertical natural capacitor (VNCAP) structure and a semiconductor device including the same.

2. Description of the Related Art

Capacitors function to store charges and to supply charges required for operations of semiconductor devices. As semiconductor devices are highly integrated, the size of a unit cell decreases, and the capacitance required for operations of semiconductor devices increases. However, since there is a limit in selecting a dielectric material constituting a capacitor, there is a difficulty in increasing capacitance per unit area of a capacitor.

SUMMARY

According to an aspect of embodiments, there is provided a capacitor structure including a substrate having an electrode pad and a ground pad, a plurality of dielectric layers on the substrate, the plurality of dielectric layers being at different levels on the substrate, a plurality of conductive pattern layers in at least two dielectric layers of the plurality of dielectric layers, the at least two dielectric layers of the plurality of dielectric layers being first dielectric layers, a plurality of via plugs connecting the plurality of conductive pattern layers to each other, and at least one contact layer in at least one second dielectric layer of the plurality of dielectric layers, the at least one second dielectric layer being different from the at least two first dielectric layers, and the at least one contact layer electrically connecting the plurality of conductive pattern layers to the electrode pad and the ground pad.

According to another aspect of embodiments, there is provided a capacitor structure including a substrate having an electrode pad and a ground pad, a plurality of conductive pattern layers respectively located at different levels on the substrate, a via plug connecting the plurality of conductive pattern layers to each other, a dielectric surrounding the plurality of conductive pattern layers and the via plug, and at least one contact layer located at a level, at which the plurality of conductive pattern layers are not located, and electrically connecting the plurality of conductive pattern layers to the electrode pad and the ground pad.

According to yet another aspect of embodiments, there is provided a semiconductor device including a substrate having an electrode pad and a ground pad, a capacitor structure located on the substrate, and a post electrically connected to the electrode pad and the ground pad and located outside the capacitor structure, wherein the capacitor structure includes a plurality of conductive pattern layers respectively located at different levels, a via plug connecting the plurality of conductive pattern layers to each other, a dielectric surrounding the plurality of conductive pattern layers and the via plug, at least one contact layer located at a level, at which the plurality of conductive pattern layers are not located, and contacting the post, and a contact plug electrically connecting the plurality of conductive pattern layers to the contact layer and located over or under the contact layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, embodiments will be described in detail with reference to the accompanying drawings. As used herein, the term "level" refers to a height along a vertical direction (Z direction) from a substrate. In addition, an N-th level (where N is a natural number) is closer to the substrate than an N+1-th level.

Figure 1A:
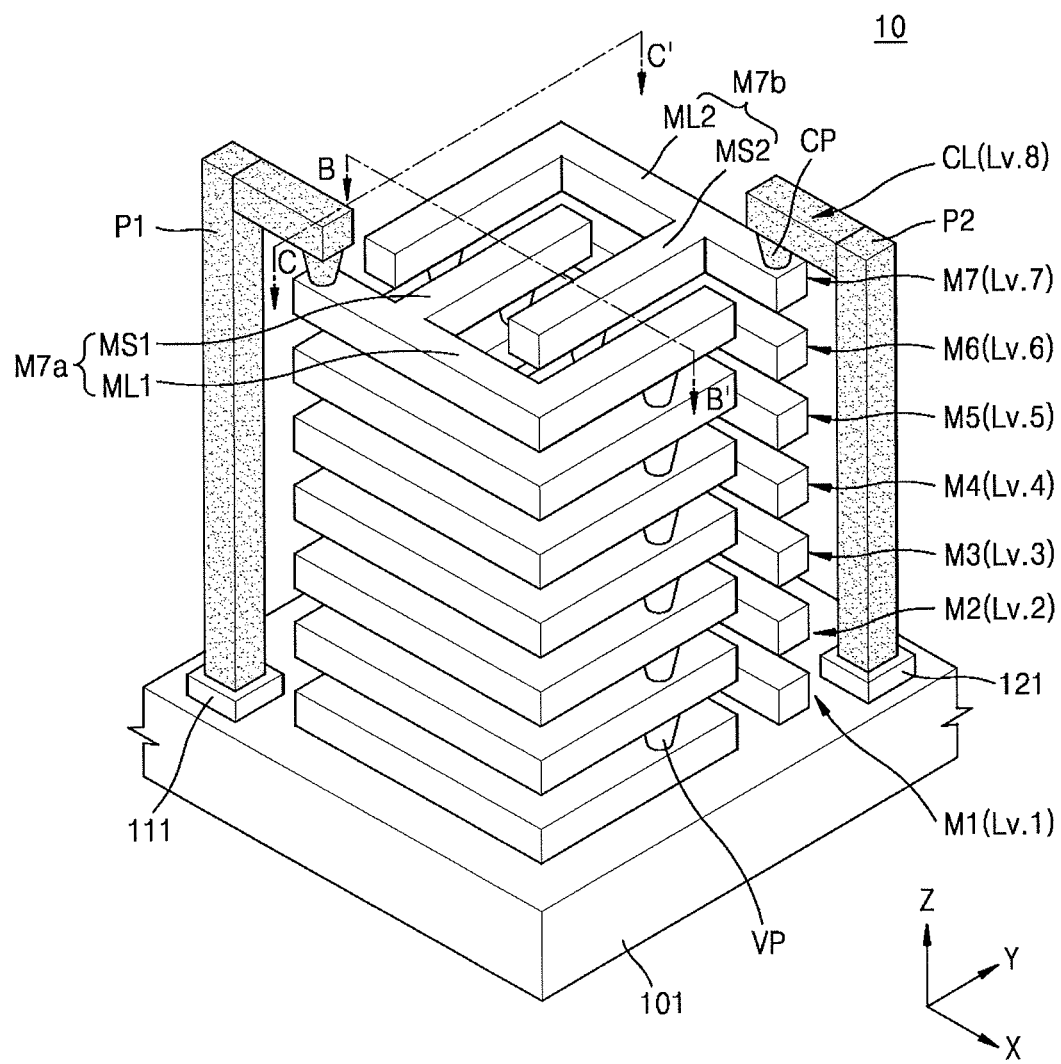
FIG. 1A illustrates a schematic perspective view of a capacitor structure according to an embodiment.
Figure 1B:
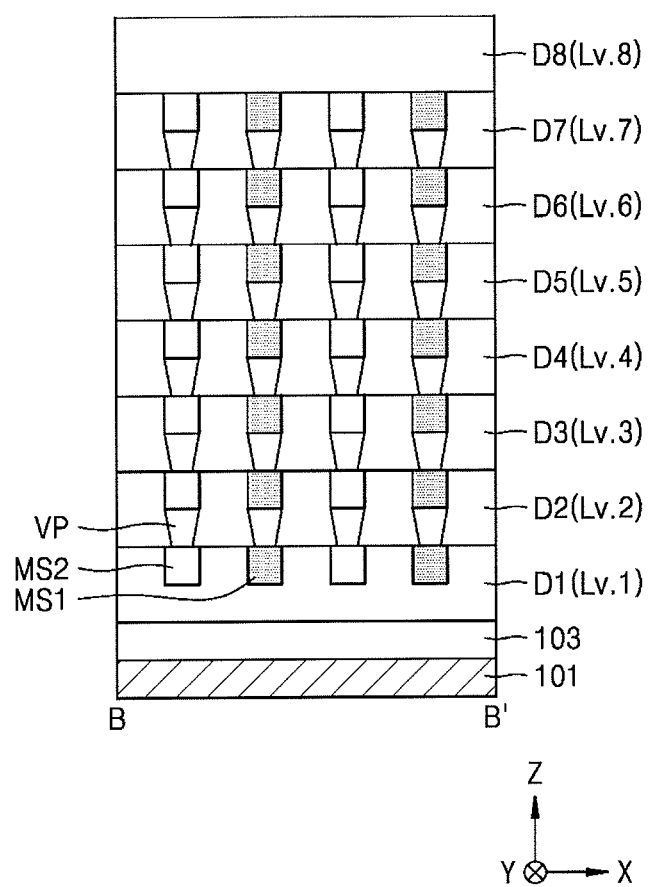
FIGS. 1B and 1C illustrate cross-sectional views along lines B-B' and C-C' of FIG. 1A, respectively.
Figure 1C:
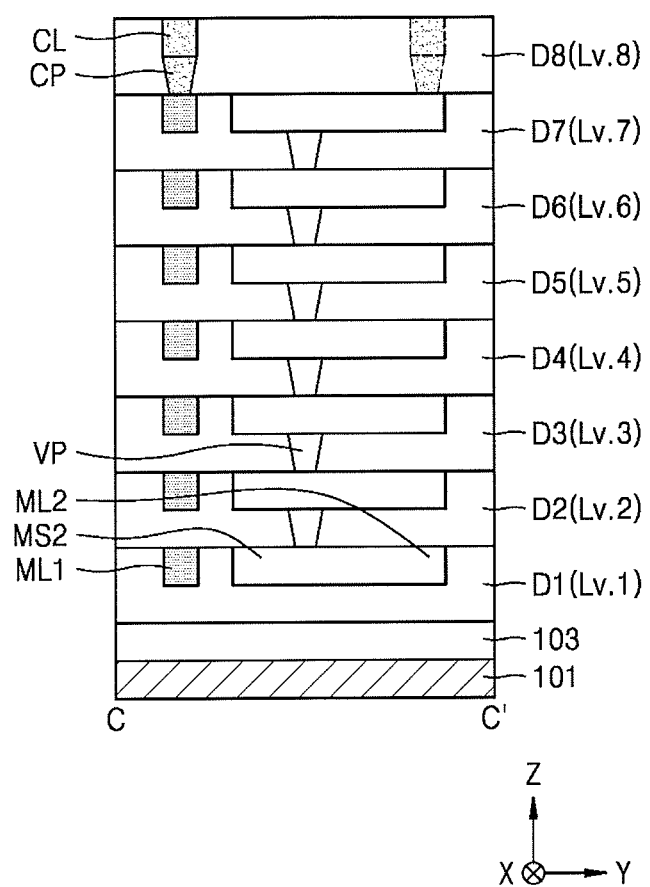

FIG. 1A is a schematic perspective view illustrating a capacitor structure according to an embodiment, and FIGS. 1B and 1C are cross-sectional views taken along lines B-B' and C-C' of FIG. 1A, respectively.

Referring to FIG. 1A, a capacitor structure 10 may include an electrode pad 111, a ground pad 121, a plurality of conductive pattern layers M1 to M7 respectively located at different levels Lv.1 to Lv.7, a via plug VP connecting the plurality of conductive pattern layers M1 to M7 to each other, a contact layer CL located at a higher level Lv.8 than the plurality of conductive pattern layers M1 to M7, a contact plug CP connecting the plurality of conductive pattern layers M1 to M7 to the contact layer CL, and posts P1 and P2 respectively connected to the electrode pad 111 and the ground pad 121.

Although dielectric layers D1 to D8 (see FIG. 1B) respectively constituting dielectrics defined at levels Lv.1 to Lv.8 are omitted from FIG. 1A to clearly illustrate a three-dimensional structure, the dielectric layers D1 to D8 may surround the plurality of conductive pattern layers M1 to M7 and the contact layer CL in an actual configuration of the capacitor structure 10, as shown in FIGS. 1B and 1C. The dielectric layers D1 to D8 will be described in more detail below with reference to FIGS. 1B and 1C.

The capacitor structure 10 may define a vertical natural capacitor (VNCAP) structure. Features of a general VNCAP structure are as follows.

A VNCAP structure is an on-chip type capacitor that is integrated with a metal wiring line and an interlayer dielectric of a semiconductor device during a back-end-of-the-line (BEOL) process. The VNCAP structure may be arranged adjacent to various components of a semiconductor device to minimize inductive and/or resistive loss which may be incurred when an off-chip type capacitor is used.

The VNCAP structure may be formed by the same process as a process of forming a metal wiring line and an interlayer dielectric of a semiconductor device. Therefore, since a process of forming the VNCAP structure may be performed without an additional photomask, the VNCAP structure may be economically formed by a relatively simple process.

A general VNCAP structure may include comb-structured conductive pattern layers alternately arranged at a level of a metal wiring line of a semiconductor device. A conductive pattern layer is connected to a substantially identical structure thereto directly over or directly under the conductive pattern layer, thereby forming a stack. A comb structure having a quadrangular shape may have an angled edge.

During some processes of a process of forming the general VNCAP structure, a process using plasma (for example, a PVD process) may be performed while at least a portion of the angled edge is exposed, and the angled edge may structurally function as an antenna. Therefore, at the same level as a level at which the comb-structured conductive pattern layer is formed, if the conductive pattern layer directly contacts a contact layer, and thus is electrically connected to an electrode pad and a ground pad, a voltage difference may be generated between the conductive pattern layers. In this case, a high electric flux density region, which may cause breakdown of a capacitor, a short circuit, current leakage through a dielectric, or the like, may be generated at the angled edge of the comb structure.

This may affect a function of a capacitor and cause deterioration in the reliability of a semiconductor device as a result. These problems may more frequently occur, as an interval between the comb-structured conductive pattern layers constituting a capacitor structure gradually decreases along with increasingly finer design rules of a semiconductor device.

In contrast, according to embodiments, the problems of the general VNCAP structure set forth above may be reduced by applying design rules allowing the plurality of conductive pattern layers M1 to M7 and the contact layer CL not to be located at the same level in the capacitor structure 10. That is, the contact layer CL may at a different level than either of the conductive pattern layers M1 to M7, whereby the reliability of the capacitor structure 10 and the productivity of a semiconductor device 100 (see FIG. 7) may be improved.

That is, the capacitor structure 10 may be formed such that the plurality of conductive pattern layers M1 to M7 and the contact layer CL are respectively located at different levels. In addition, the capacitor structure 10 may include the posts P1 and P2 directly contacting and electrically connected to the contact layer CL and the via plug VP contacting and electrically connected to each of the plurality of conductive pattern layers M1 to M7.

As shown, the plurality of conductive pattern layers M1 to M7 may be sequentially located in this stated order. Although the plurality of conductive pattern layers M1 to M7 are shown as including seven layers stacked in a third direction (Z direction), embodiments are not limited thereto, e.g., two to six layers or eight or more layers may be stacked in the third direction (Z direction).

In other words, if a plurality of conductive pattern layers are respectively located at first to N-th levels (where N is a natural number of 2 or more), a contact layer may be located at an N+1-th level. That is, the plurality of conductive pattern layers and the contact layer may not be located at the same level.

That is, the plurality of conductive pattern layers M1 to M7 may be formed to electrically float without being connected to the electrode pad 111 and the ground pad 121 in the process of forming the plurality of conductive pattern layers M1 to M7, and may be finally electrically connected to the contact layer CL at a higher level Lv.8 via the contact plug CP. In this case, since the plurality of conductive pattern layers M1 to M7 are not electrically connected to the electrode pad 111 and the ground pad 121 in the process of forming the plurality of conductive pattern layers M1 to M7, a potential difference may not be generated in the plurality of conductive pattern layers M1 to M7. Therefore, the possibility of causing breakdown of a capacitor, a short circuit, or current leakage through a dielectric may be substantially lowered.

Each of the plurality of conductive pattern layers M1 to M7 may include a first conductive pattern electrically connected to the electrode pad 111, and a second conductive pattern electrically isolated from the first conductive pattern and electrically connected to the ground pad 121. For example, referring to FIGS. 1A-1C, the electrode pad 111 and the ground pad 121 may be electrical pads on the substrate 101, e.g., at a same level as the first conductive pattern layer M1.

Each of the first conductive pattern and the second conductive pattern may have a comb structure, and may be arranged in a first direction (X direction) and a second direction (Y direction) that is perpendicular to the first direction (X direction). This will be described below in detail.

The plurality of conductive pattern layers M1 to M7 may be electrically connected to the contact layer CL via the contact plug CP extending in the third direction (Z direction) that is perpendicular to each of the first and second directions (X and Y directions). That is, an electrical connection path between the plurality of conductive pattern layers M1 to M7 and the posts P1 and P2 may be as long as possible.

The contact layer CL may include a first contact pattern electrically connected to the electrode pad 111 and the first conductive pattern, and a second contact pattern electrically isolated from the first contact pattern and electrically connected to the ground pad 121 and the second conductive pattern. The first contact pattern and the second contact pattern may be located at the same level Lv.8. This will be described below in detail.

Although electrically connected to the posts P1 and P2, the plurality of conductive pattern layers M1 to M7 may not directly contact the posts P1 and P2. That is, the plurality of conductive pattern layers M1 to M7 may be electrically connected to the posts P1 and P2 via the contact layer CL and the contact plug CP.

Referring to FIGS. 1B and 1C, the capacitor structure 10 may include a substrate 101, an inter-metal dielectric (IMD) 103, and the plurality of dielectric layers D1 to D8 respectively located at a plurality of levels Lv.1 to Lv.8 on the inter-metal dielectric 103.

In some figures, portions of the contact plug CP and the contact layer CL, which are placed ahead/behind with respect to the corresponding cross-section in the first direction (X direction), are marked by a dashed line. In addition, to distinguish the first conductive pattern from the second conductive pattern, the first conductive pattern and the second conductive pattern are illustrated with different hatch patterns from each other.

That the plurality of dielectric layers D1 to D8 are respectively located at the plurality of levels Lv.1 to Lv.8 has substantially the same meaning as that the plurality of dielectric layers D1 to D8 form a vertical structure in the third direction (Z direction) on the substrate 101, e.g., the plurality of dielectric layers D1 to D8 may be directly stacked on top of each other on the substrate 101. A dielectric material constituting each of the plurality of dielectric layers D1 to D8 constitutes the capacitor structure 10. That is, charges may be stored by using the plurality of conductive pattern layers M1 to M7 (see FIG. 1A) and the plurality of dielectric layers D1 to D8.

Each of the plurality of conductive pattern layers M1 to M7 (see FIG. 1A) includes the first conductive pattern electrically connected to the electrode pad 111 (see FIG. 1A), and the second conductive pattern electrically isolated from the first conductive pattern and electrically connected to the ground pad 121 (see FIG. 1A). For example, as illustrated in FIG. 1A, a seventh conductive pattern layer M7 may include a first conductive pattern M7a and a second conductive pattern M7b at a same level, e.g., having substantially level bottom surfaces and at a same distance from a top surface of the substrate 101.

The first conductive pattern may include a first line pattern ML1 extending in the first direction (X direction), and a plurality of first sub-line patterns MS1 branching off from the first line pattern ML1 and extending in the second direction (Y direction). The second conductive pattern may include a second line pattern ML2 extending in the first direction (X direction), and a plurality of second sub-line patterns MS2 branching off from the second line pattern ML2 and extending in the second direction (Y direction). For example, as illustrated in FIG. 1A, the first conductive pattern M7a of the seventh conductive pattern layer M7 may include the first line pattern ML1 with the plurality of first sub-line patterns MS1 extending from the first line pattern ML1 toward the second line pattern ML2, e.g., in parallel to each other, and the second conductive pattern M7b of the seventh conductive pattern layer M7 may include the second line pattern ML2 in parallel to the first line pattern ML1 with the plurality of second sub-line patterns MS2 extending from the second line pattern ML2 toward the first line pattern ML1, e.g., in parallel to each other and to the first sub-line patterns MS1.

The first line pattern ML1 and the second line pattern ML2 may be located parallel to each other, and the plurality of first sub-line patterns MS1 and the plurality of second sub-line patterns MS2 may be alternately located. That is, each of the first conductive patterns and the second conductive patterns, which constitute each of the plurality of conductive pattern layers M1 to M7 (see FIG. 1A), may have a comb structure. For example, as further illustrated in FIG. 1A, the first and second conductive patterns M7a and M7b may have complementary shapes with the first and second sub-line patterns MS1 and MS2 arranged alternately with respect to each other in the XY plane, as viewed in a top view (e.g., as viewed in FIG. 5).

The first and second line patterns ML1 and ML2 and the plurality of first and second sub-line patterns MS1 and MS2 may be located in some layers (D1 to D7) of the plurality of dielectric layers D1 to D8 respectively located at the plurality of levels Lv.1 to Lv.8. For example, as illustrated in FIGS. 1B and 1C, the first and second line patterns ML1 and ML2 and the first and second sub-line patterns MS1 and MS2 of each of the conductive pattern layers M1 to M7 extend through respective ones of the dielectric layers D1 to D8.

The contact plug CP may be located to directly contact the first and second line patterns ML1 and ML2, and the via plug VP may be located to directly contact the plurality of first and second sub-line patterns MS1 and MS2. However, embodiments are not limited thereto. For example, the contact plug CP may be located to directly contact the plurality of first and second sub-line patterns MS1 and MS2, and the via plug VP may be located to directly contact the first and second line patterns ML1 and ML2.

The plurality of conductive pattern layers M1 to M7 (see FIG. 1A) may have a vertical structure in which the plurality of conductive pattern layers M1 to M7 are electrically connected to each other via the via plug VP. That is, the via plug VP may be formed between the plurality of first sub-line patterns MS1 at one level and those at another level and between the plurality of second sub-line patterns MS2 at one level and those at another level. On the other hand, the contact plug CP may be formed to directly contact only uppermost first and second line patterns ML1 and ML2 located at a level Lv.7.

The first and second line patterns ML1 and ML2 and the plurality of first and second sub-line patterns MS1 and MS2 may be formed by a self-aligned double patterning (SADP) process. In addition, the via plug VP and the contact plug CP may be formed by a damascene or dual damascene process. Since the above processes in a process of forming a semiconductor device could be performed by those skilled in the art, descriptions thereof will be omitted.

A conductive material constituting each of the plurality of conductive pattern layers M1 to M7 (see FIG. 1A) may include at least one of, e.g., nitride films, metal layers, and combinations thereof. For example, the conductive material constituting each of the plurality of conductive pattern layers M1 to M7 may include titanium, titanium nitride, tantalum, tantalum nitride, tungsten, copper, aluminum, a mixture thereof, or a compound thereof, without being limited thereto.

A dielectric material constituting each of the plurality of dielectric layers D1 to D8 may include, e.g., a silicon oxide film or a silicon nitride film alone, or include a material obtained by alternately stacking a silicon oxide film and a silicon nitride film. Alternatively, the dielectric material constituting each of the plurality of dielectric layers D1 to D8 may include an oxide, e.g., phosphosilicate glass (PSG), borophosphosilicate glass (BPSG), undoped silicate glass (USG), tetraethyl orthosilicate (TEOS), plasma enhanced-TEOS (PE-TEOS), high density plasma-chemical vapor deposition (HDP-CVD) oxide, a low-K material used in BEOL, or an ultra low-K material.

Figure 2A:
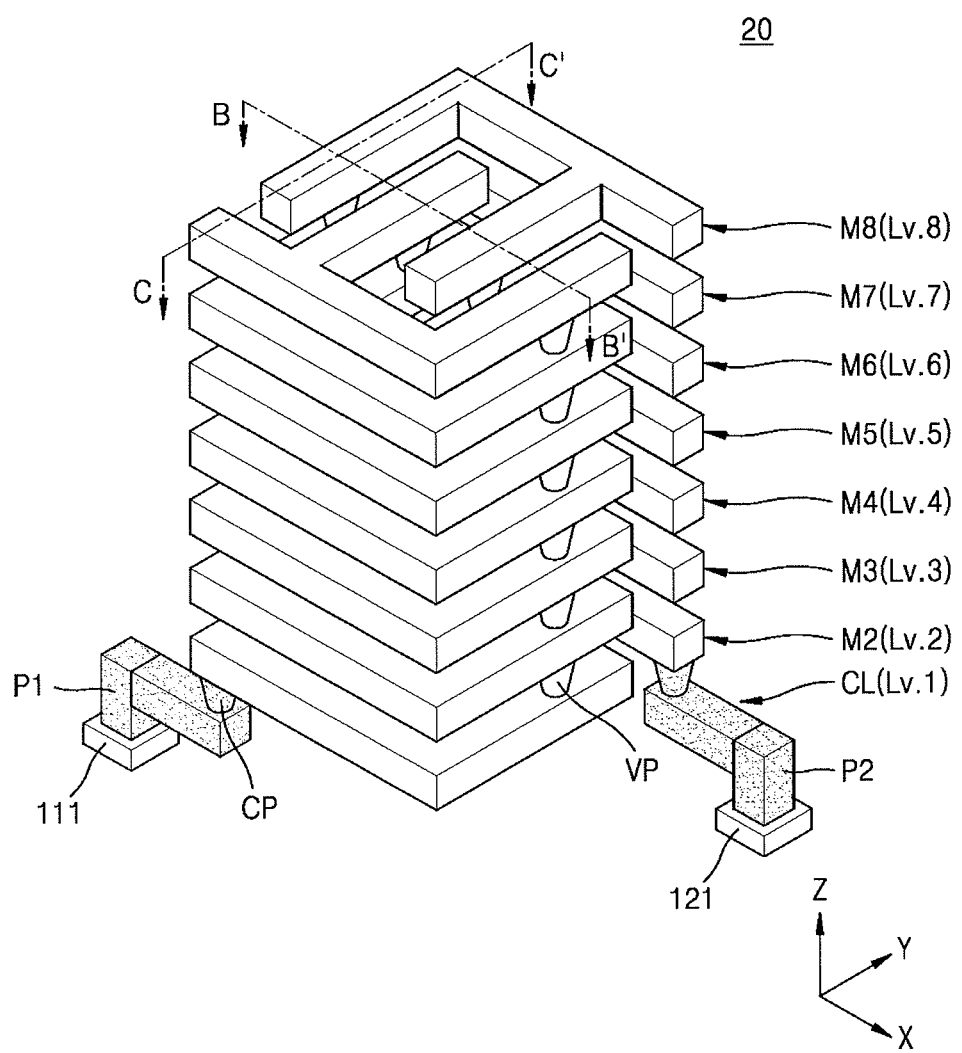
FIG. 2A illustrates a schematic perspective view of a capacitor structure according to an embodiment.
Figure 2B:
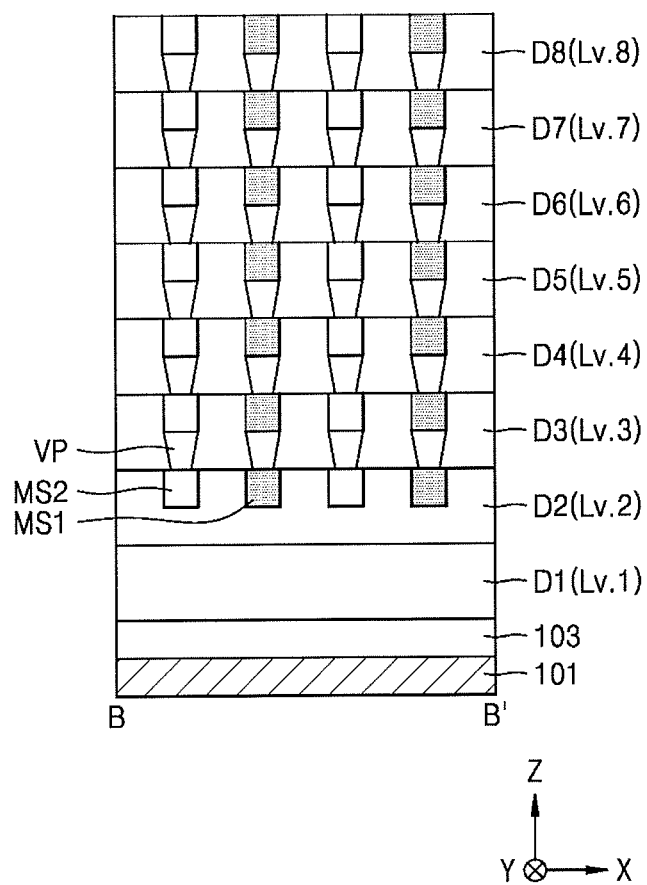
FIGS. 2B and 2C illustrate cross-sectional views along lines B-B' and C-C' of FIG. 2A, respectively.
Figure 2C:
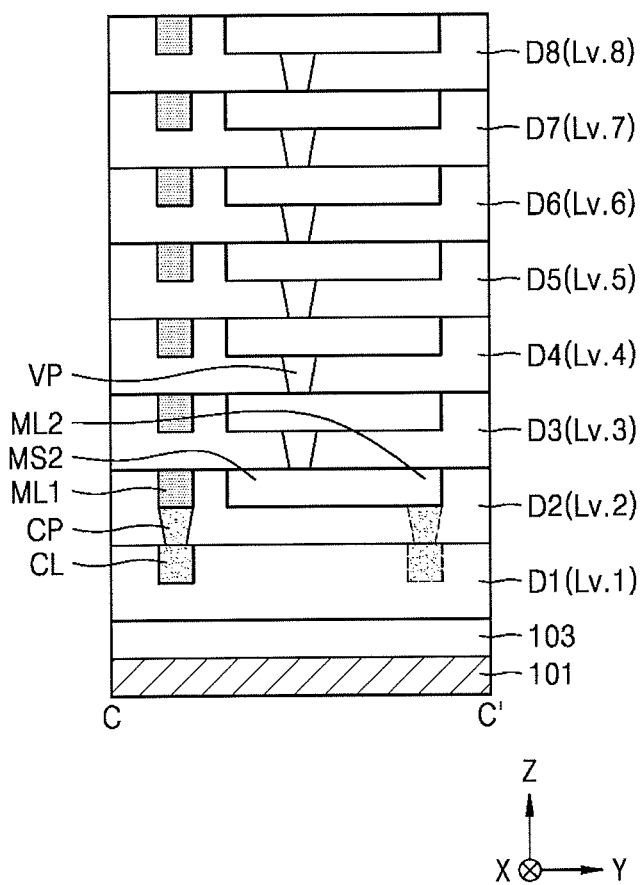

FIG. 2A is a schematic perspective view illustrating a capacitor structure according to an embodiment, and FIGS. 2B and 2C are cross-sectional views along lines B-B' and C-C' of FIG. 2A, respectively. The structure of the capacitor in FIGS. 2A-2C is the same as or similar to that described with reference to FIGS. 1A to 1C, and therefore, mainly differences relatively to FIGS. 1A-1C will be described hereinafter.

Referring to FIG. 2A, a capacitor structure 20 may include the electrode pad 111, the ground pad 121, a plurality of conductive pattern layers M2 to M8 respectively located at different levels Lv.2 to Lv.8, the via plug VP connecting the plurality of conductive pattern layers M2 to M8 to each other, the contact layer CL located at a lower level Lv.1 than the plurality of conductive pattern layers M2 to M8, the contact plug CP electrically connecting the plurality of conductive pattern layers M2 to M8 to the contact layer CL, and the posts P1 and P2 respectively electrically connected to the electrode pad 111 and the ground pad 121.

Although the dielectric layers D1 to D8 (see FIG. 2B) respectively constituting dielectrics defined at the levels Lv.1 to Lv.8 are omitted from FIG. 2A to clearly illustrate a three-dimensional structure, the dielectric layers D1 to D8 may surround the plurality of conductive pattern layers M2 to M8 and the contact layer CL in an actual configuration of the capacitor structure 20, as shown in FIGS. 2B and 2C.

According to embodiments, the problems set forth above are reduced by applying design rules allowing the plurality of conductive pattern layers M2 to M8 and the contact layer CL not to be located at the same level in the capacitor structure 20, whereby the reliability of the capacitor structure 20 and the productivity of the semiconductor device 100 (see FIG. 7) may be improved.

The capacitor structure 20 may be formed such that the plurality of conductive pattern layers M2 to M8 and the contact layer CL are respectively located at different levels. In addition, the capacitor structure 20 may include the posts P1 and P2 directly contacting and electrically connected to the contact layer CL and the via plug VP contacting and electrically connected to each of the plurality of conductive pattern layers M2 to M8.

As shown, the plurality of conductive pattern layers M2 to M8 may be sequentially located in this stated order. Although the plurality of conductive pattern layers M2 to M8 are shown as including seven layers stacked in the third direction (Z direction), embodiments are not limited thereto, and two to six layers or eight or more layers may be stacked in the third direction (Z direction).

In other words, if the plurality of conductive pattern layers are respectively located at second to N-th levels (where N is a natural number of 3 or more), the contact layer may be located at the first level. That is, the plurality of conductive pattern layers and the contact layer may not be located at the same level.

That is, the plurality of conductive pattern layers M2 to M8 may be formed to be electrically connected to the contact layer CL at the lower level (Lv.1) via the contact plug CP in the process of forming the plurality of conductive pattern layers M2 to M8. In this case, since the plurality of conductive pattern layers M2 to M8, despite being electrically connected to the electrode pad 111 and the ground pad 121 in the process of forming the plurality of conductive pattern layers M2 to M8, are connected thereto via the contact plug CP that is not located at the same level (Lv.1) as the contact layer CL, a large potential difference may not be generated in the plurality of conductive pattern layers M2 to M8. Therefore, the possibility of causing breakdown of a capacitor, a short circuit, or current leakage through a dielectric may be lowered.

Each of the plurality of conductive pattern layers M2 to M8 may include the first conductive pattern electrically connected to the electrode pad 111, and the second conductive pattern electrically isolated from the first conductive pattern and electrically connected to the ground pad 121.

Referring to FIGS. 2B and 2C, the capacitor structure 20 may include the substrate 101, the inter-metal dielectric 103, and the plurality of dielectric layers D1 to D8 respectively located at the plurality of levels Lv.1 to Lv.8 on the inter-metal dielectric 103.

In some figures, portions of the contact plug CP and the contact layer CL, which are placed ahead/behind with respect to the corresponding cross-section in the first direction (X direction), are marked by a dashed line. In addition, to distinguish the first conductive pattern from the second conductive pattern, the first conductive pattern and the second conductive pattern are illustrated with different hatch patterns from each other.

The first and second line patterns ML1 and ML2 and the plurality of first and second sub-line patterns MS1 and MS2 may be located in some layers (D2 to D8) of the plurality of dielectric layers D1 to D8 respectively located at the plurality of levels Lv.1 to Lv.8. The contact plug CP may be located to directly contact the first and second line patterns ML1 and ML2, and the via plug VP may be located to directly contact the plurality of first and second sub-line patterns MS1 and MS2. However, embodiments are not limited thereto.

The plurality of conductive pattern layers M2 to M8 (see FIG. 2A) may have a vertical structure in which the plurality of conductive pattern layers M2 to M8 are electrically connected to each other via the via plug VP. That is, the via plug VP may be formed between the plurality of first sub-line patterns MS1 at one level and those at another level and between the plurality of second sub-line patterns MS2 at one level and those at another level. On the other hand, the contact plug CP may be formed to directly contact only lowermost first and second line patterns ML1 and ML2 located at a level Lv.2.

Figure 3A:
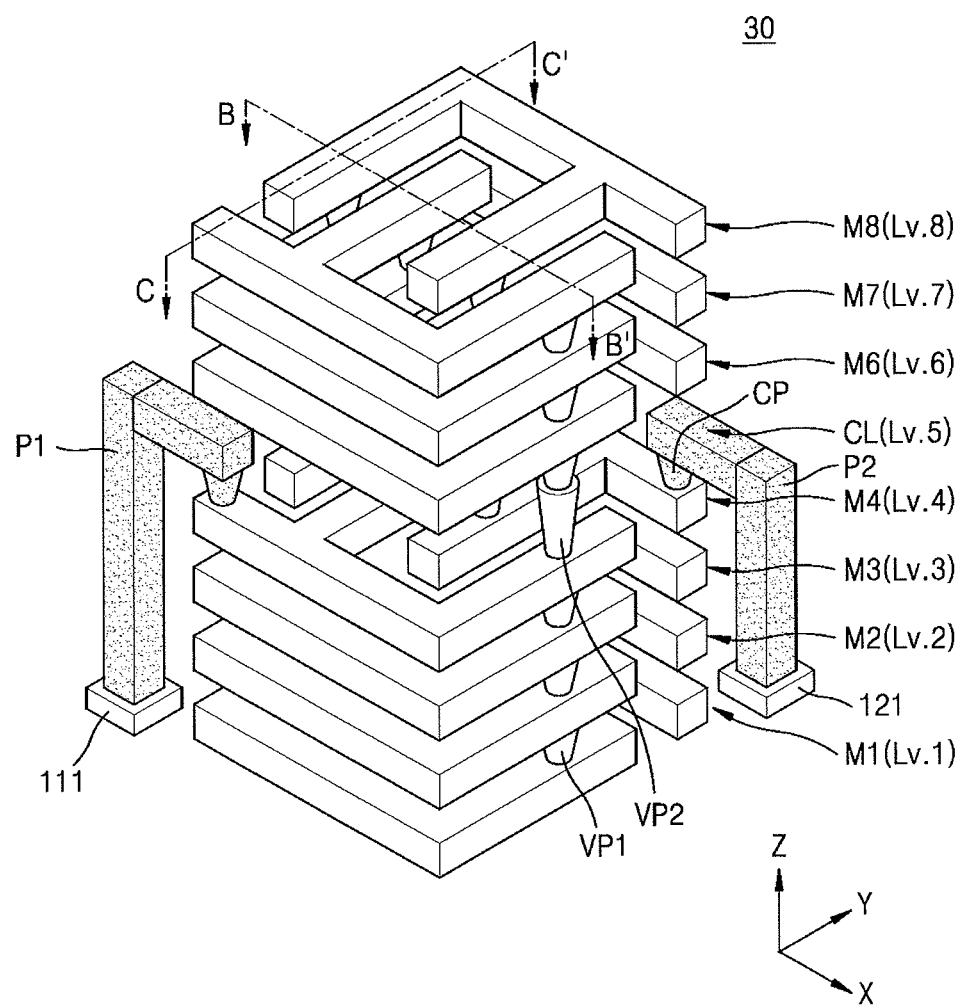
FIG. 3A illustrates a schematic perspective view of a capacitor structure according to an embodiment.
Figure 3B:
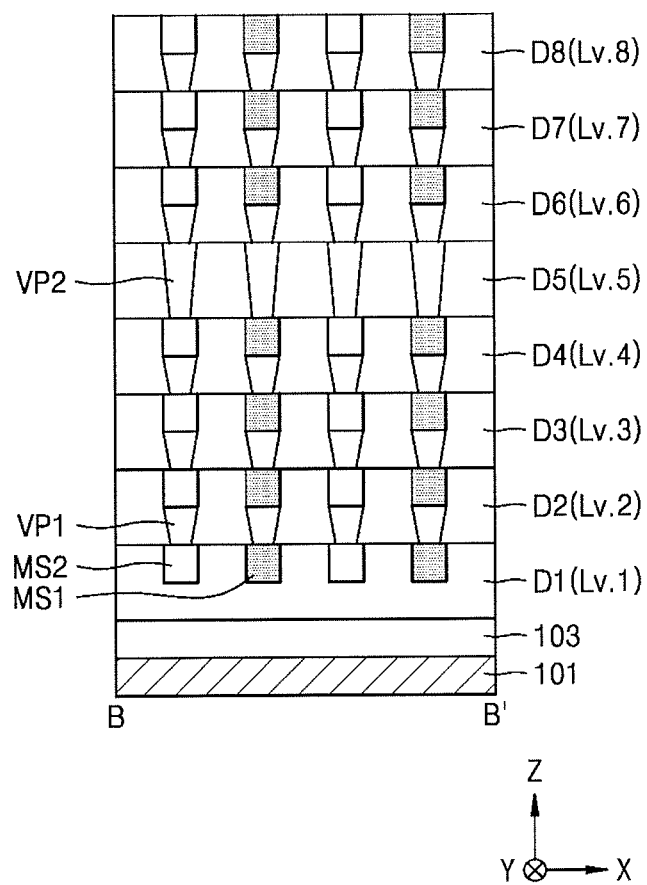
FIGS. 3B and 3C illustrate cross-sectional views along lines B-B' and C-C' of FIG. 3A, respectively.
Figure 3C:
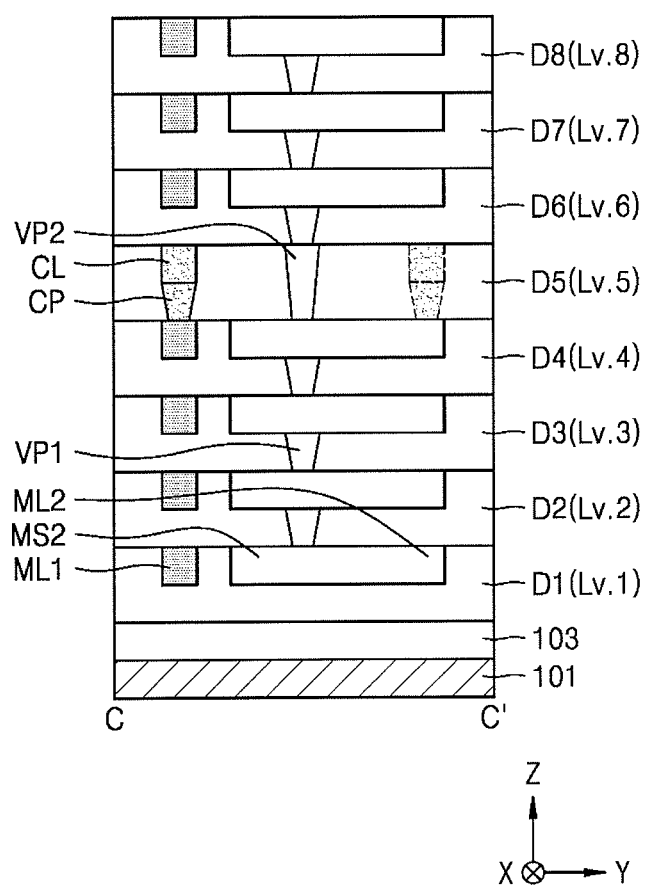

FIG. 3A is a schematic perspective view illustrating a capacitor structure according to an embodiment, and FIGS. 3B and 3C are cross-sectional views taken along lines B-B' and C-C' of FIG. 3A, respectively. The structure of the capacitor in FIGS. 3A-3C is the same as or similar to that described with reference to FIGS. 1A to 1C, and therefore, mainly differences relatively to FIGS. 1A-1C will be described hereinafter.

Referring to FIG. 3A, a capacitor structure 30 may include the electrode pad 111, the ground pad 121, a plurality of conductive pattern layers M1 to M4 and M6 to M8 respectively located at different levels Lv.1 to Lv.4 and Lv.6 to Lv.8, via plugs VP1 and VP2 connecting the plurality of conductive pattern layers M1 to M4 and M6 to M8 to each other, the contact layer CL located at an intermediate level Lv.5 with respect to the plurality of conductive pattern layers M1 to M4 and M6 to M8, the contact plug CP electrically connecting the plurality of conductive pattern layers M1 to M4 and M6 to M8 to the contact layer CL, and the posts P1 and P2 respectively electrically connected to the electrode pad 111 and the ground pad 121.

Although the dielectric layers D1 to D8 (see FIG. 3B) respectively constituting dielectrics defined at the levels Lv.1 to Lv.8 are omitted from FIG. 3A to clearly illustrate a three-dimensional structure, the dielectric layers D1 to D8 may surround the plurality of conductive pattern layers M1 to M4 and M6 to M8 and the contact layer CL in an actual configuration of the capacitor structure 30, as shown in FIGS. 3B and 3C.

According to embodiments, the problems set forth above are reduced by applying design rules allowing the plurality of conductive pattern layers M1 to M4 and M6 to M8 and the contact layer CL not to be located at the same level in the capacitor structure 30, whereby the reliability of the capacitor structure 30 and the productivity of the semiconductor device 100 (see FIG. 7) may be improved.

The capacitor structure 30 may be formed such that the plurality of conductive pattern layers M1 to M4 and M6 to M8 and the contact layer CL are respectively located at different levels. In addition, the capacitor structure 30 may include the posts P1 and P2 directly contacting and electrically connected to the contact layer CL and via plugs VP1 and VP2 contacting and electrically connected to the plurality of conductive pattern layers M1 to M4 and M6 to M8.

The plurality of conductive pattern layers M1 to M4 and M6 to M8 are arranged in the third direction (Z direction) except at some levels. Although the plurality of conductive pattern layers M1 to M4 and M6 to M8 are shown as including seven layers stacked in the third direction (Z direction), the embodiments are not limited thereto, and two to six layers or eight or more layers may be stacked in the third direction (Z direction).

In other words, if the plurality of conductive pattern layers is respectively located at first to N-th levels (where N is a natural number of 2 or more), except at a K-th level (where K is one of natural numbers ranging from 2 to N−1), the contact layer may be located at the K-th level. That is, the plurality of conductive pattern layers and the contact layer may not be located at the same level.

That is, the plurality of conductive pattern layers M1 to M4 and M6 to M8 may be formed to electrically connect to the contact layer CL at the intermediate level Lv.5 via the contact plug CP in the process of forming the plurality of conductive pattern layers M1 to M4 and M6 to M8. In this case, since some of the plurality of conductive pattern layers M1 to M4 and M6 to M8, despite being electrically connected to the electrode pad 111 and the ground pad 121 in the process of forming the plurality of conductive pattern layers M1 to M4 and M6 to M8, are connected thereto via the contact plug CP that is not located at the same level Lv.5 as the contact layer CL, a large potential difference may not be generated in the plurality of conductive pattern layers M1 to M4 and M6 to M8. Therefore, the possibility of causing breakdown of a capacitor, a short circuit, or current leakage through a dielectric may be lowered.

Each of the plurality of conductive pattern layers M1 to M4 and M6 to M8 may include the first conductive pattern electrically connected to the electrode pad 111, and the second conductive pattern electrically isolated from the first conductive pattern and electrically connected to the ground pad 121.

Referring to FIGS. 3B and 3C, the capacitor structure 30 may include the substrate 101, the inter-metal dielectric 103, and the plurality of dielectric layers D1 to D8 respectively located at the plurality of levels Lv.1 to Lv.8 on the inter-metal dielectric 103.

In some figures, portions of the contact plug CP and the contact layer CL, which are placed ahead/behind with respect to the corresponding cross-section in the first direction (X direction), are marked by a dashed line. In addition, to distinguish the first conductive pattern from the second conductive pattern, the first conductive pattern and the second conductive pattern are illustrated with different hatch patterns from each other.

The first and second line patterns ML1 and ML2 and the plurality of first and second sub-line patterns MS1 and MS2 may be located in some layers (D1 to D4 and D6 to D8) of the plurality of dielectric layers D1 to D8 respectively located at the plurality of levels Lv.1 to Lv.8. The contact plug CP may be located to directly contact the first and second line patterns ML1 and ML2, and the via plugs VP1 and VP2 may be located to directly contact the plurality of first and second sub-line patterns MS1 and MS2. However, embodiments are not limited thereto.

The plurality of conductive pattern layers M1 to M4 and M6 to M8 (see FIG. 3A) may have a vertical structure in which the plurality of conductive pattern layers M1 to M4 and M6 to M8 are electrically connected to each other via the via plugs VP1 and VP2. That is, the via plugs VP1 and VP2 may be formed between the plurality of first sub-line patterns MS1 at one level and those at another level and between the plurality of second sub-line patterns MS2 at one level and those at another level. On the other hand, the contact plug CP may be formed to directly contact only the first and second line patterns ML1 and ML2 located at an intermediate level Lv.4.

When the contact layer CL is located between the plurality of conductive pattern layers M1 to M4 and M6 to M8 (see FIG. 3A), a second via plug VP2 providing a connection between two conductive pattern layers M4 and M6 facing the contact layer CL may have a greater height than a first via plug VP1 providing a connection between other conductive pattern layers M1 to M4 and M6 to M8.

That is, since no conductive pattern layer is located at the intermediate level Lv.5 at which the contact layer CL is located, the second via plug VP2 providing a connection between the conductive pattern layers M4 and M6 may have a height in the third direction (Z direction), which is further increased by the height of the conductive pattern layer.

Figure 4A:
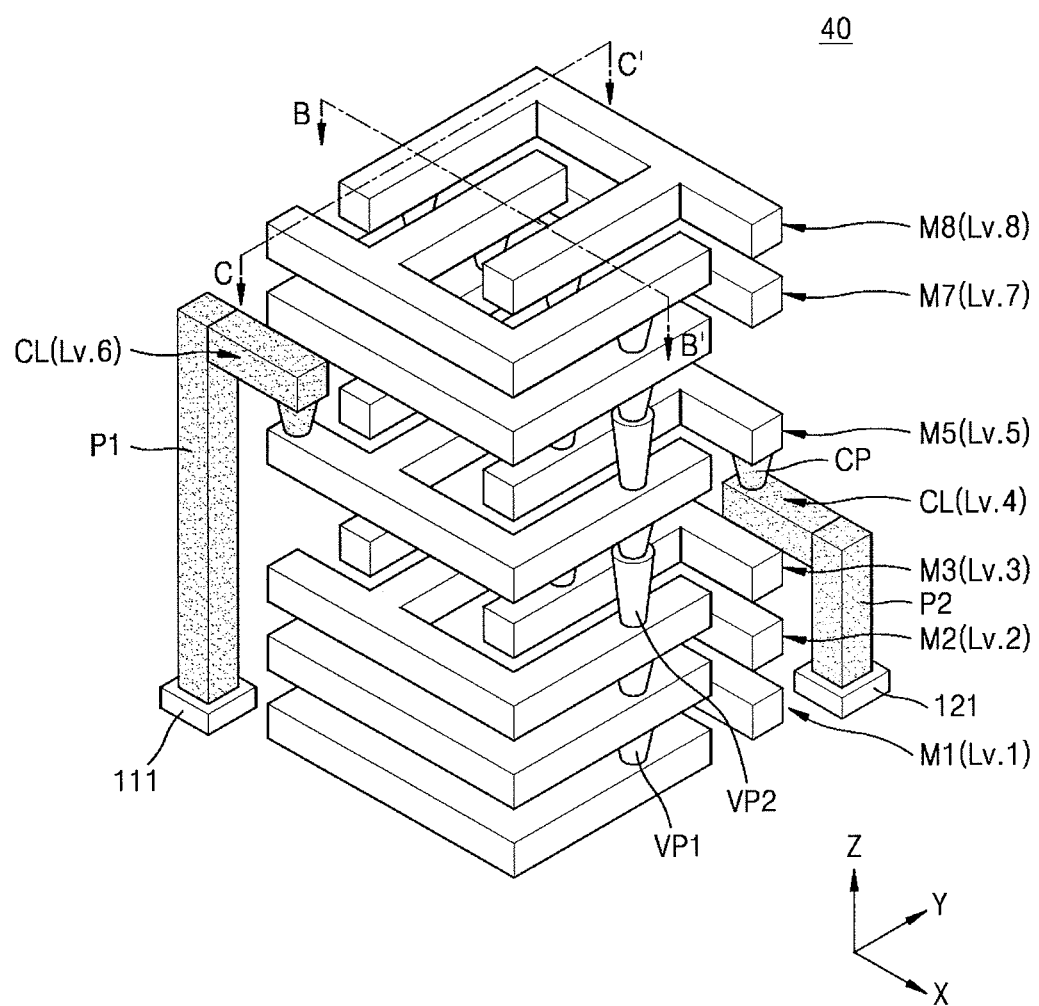
FIG. 4A illustrates a schematic perspective view of a capacitor structure according to an embodiment.
Figure 4B:
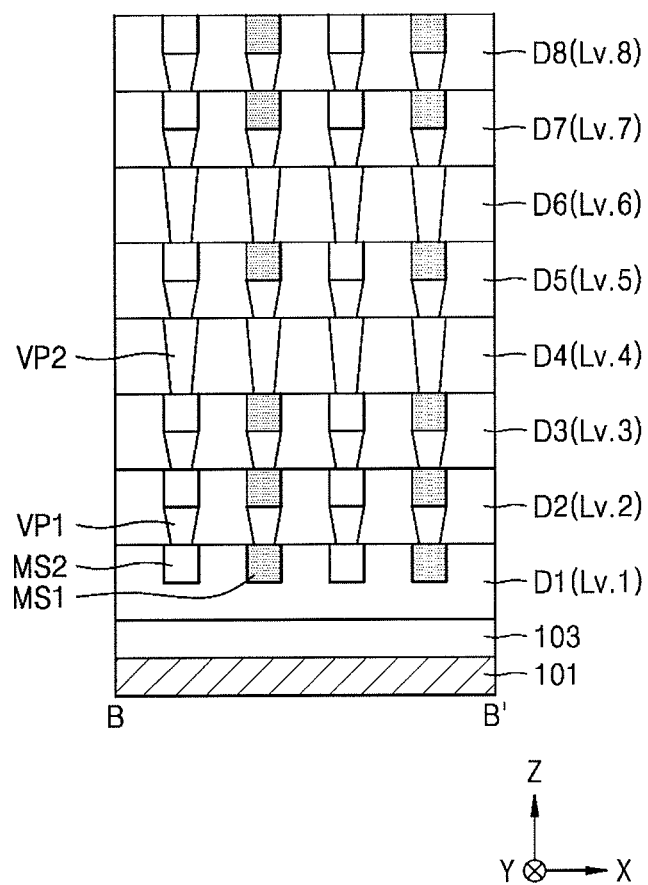
FIGS. 4B and 4C illustrate cross-sectional views along lines B-B' and C-C' of FIG. 4A, respectively.
Figure 4C:
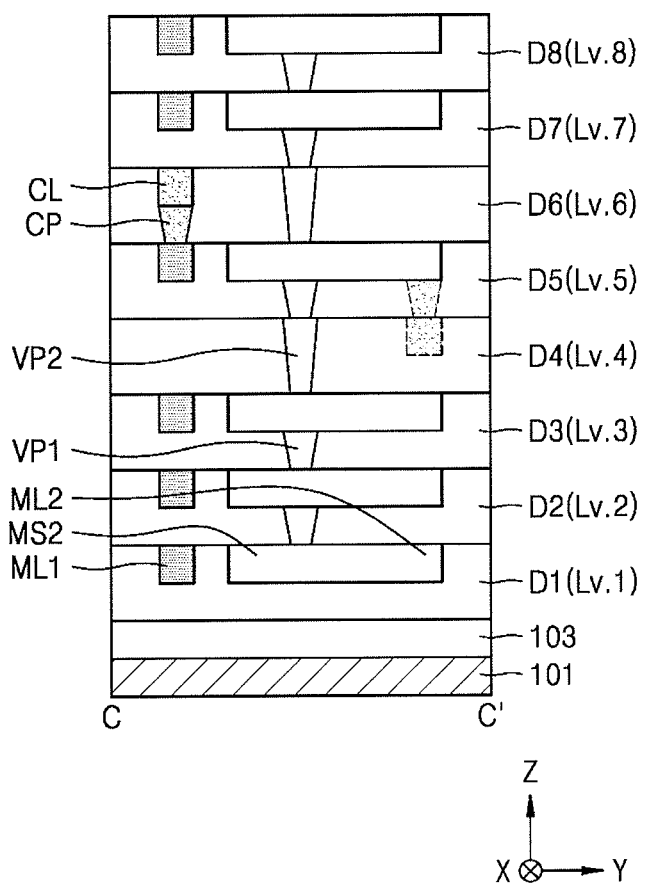

FIG. 4A is a schematic perspective view illustrating a capacitor structure according to an embodiment, and FIGS. 4B and 4C are cross-sectional views taken along lines B-B' and C-C' of FIG. 4A, respectively. The structure of the capacitor in FIGS. 4A-4C is the same as or similar to that described with reference to FIGS. 1A to 1C, and therefore, mainly differences relatively to FIGS. 1A-1C will be described hereinafter.

Referring to FIG. 4A, there is shown the capacitor structure 40 including: the electrode pad 111, the ground pad 121, a plurality of conductive pattern layers M1 to M3, M5, M7, and M8 respectively located at different levels Lv.1 to Lv.3, Lv.5, Lv.7, and Lv.8, the via plugs VP1 and VP2 connecting the plurality of conductive pattern layers M1 to M3, M5, M7, and M8 to each other, contact layers CL respectively located at intermediate levels Lv.5 and Lv.6 with respect to the plurality of conductive pattern layers M1 to M3, M5, M7, and M8, the contact plug CP electrically connecting the plurality of conductive pattern layers M1 to M3, M5, M7, and M8 to the contact layers CL, and the posts P1 and P2 respectively electrically connected to the electrode pad 111 and the ground pad 121.

Although the dielectric layers D1 to D8 (see FIG. 3B) respectively constituting dielectrics defined at the levels Lv.1 to Lv.8 are omitted from FIG. 4A to clearly illustrate a three-dimensional structure, the dielectric layers D1 to D8 may surround the plurality of conductive pattern layers M1 to M3, M5, M7, and M8 and the contact layers CL in an actual configuration of the capacitor structure 40, as shown in FIGS. 4B and 4C.

According to embodiments, the problems set forth above are reduced by applying design rules allowing the plurality of conductive pattern layers M1 to M3, M5, M7, and M8 and the contact layers CL not to be located at the same level in the capacitor structure 40, whereby the reliability of the capacitor structure 40 and the productivity of the semiconductor device 100 (see FIG. 7) may be improved.

The capacitor structure 40 may be formed such that the plurality of conductive pattern layers M1 to M3, M5, M7, and M8 and the contact layers CL are respectively located at different levels. In addition, the capacitor structure 40 may include the posts P1 and P2 directly contacting and electrically connected to the contact layers CL and the via plugs VP1 and VP2 contacting and electrically connected to the plurality of conductive pattern layers M1 to M3, M5, M7, and M8.

The plurality of conductive pattern layers M1 to M3, M5, M7, and M8 are arranged in the third direction (Z direction) except at some levels. Although the plurality of conductive pattern layers M1 to M3, M5, M7, and M8 are shown as including six layers stacked in the third direction (Z direction), embodiments are not limited thereto, and two to five layers or seven or more layers may be stacked in the third direction (Z direction).

In other words, if the plurality of conductive pattern layers are respectively located at first to N-th levels (where N is a natural number of 2 or more) except K-th levels (where K refers to two of natural numbers ranging from 2 to N−1), the contact layers may be respectively located at the K-th levels. That is, the plurality of conductive pattern layers and the contact layers may not be located at the same level.

That is, the plurality of conductive pattern layers M1 to M3, M5, M7, and M8 may be formed to electrically connect to the contact layers CL at the intermediate levels Lv.4 and Lv.6 via the contact plug CP in the process of forming the plurality of conductive pattern layers M1 to M3, M5, M7, and M8. In this case, since some of the plurality of conductive pattern layers M1 to M3, M5, M7, and M8, despite being electrically connected to the electrode pad 111 and the ground pad 121 in the process of forming the plurality of conductive pattern layers M1 to M3, M5, M7, and M8, are connected thereto via the contact plug CP that is not located at the same levels Lv.4 and Lv.6 as the contact layers CL, a large potential difference may not be generated in the plurality of conductive pattern layers M1 to M3, M5, M7, and M8. Therefore, the possibility of causing breakdown of a capacitor, a short circuit, or current leakage through a dielectric may be lowered.

Each of the plurality of conductive pattern layers M1 to M3, M5, M7, and M8 may include the first conductive pattern electrically connected to the electrode pad 111, and the second conductive pattern electrically isolated from the first conductive pattern and electrically connected to the ground pad 121.

Referring to FIGS. 4B and 4C, the capacitor structure 40 may include the substrate 101, the inter-metal dielectric 103, and the plurality of dielectric layers D1 to D8 respectively located at the plurality of levels Lv.1 to Lv.8 on the inter-metal dielectric 103.

In some figures, portions of the contact plug CP and the contact layers CL, which are placed ahead/behind with respect to the corresponding cross-section in the first direction (X direction), are marked by a dashed line. In addition, to distinguish the first conductive pattern from the second conductive pattern, the first conductive pattern and the second conductive pattern are illustrated with different hatch patterns from each other.

The first and second line patterns ML1 and ML2 and the plurality of first and second sub-line patterns MS1 and MS2 may be located in some layers (D1 to D3, D5, D7, and D8) of the plurality of dielectric layers D1 to D8 respectively located at the plurality of levels Lv.1 to Lv.8. The contact plug CP may be located to directly contact the first and second line patterns ML1 and ML2, and the via plugs VP1 and VP2 may be located to directly contact the plurality of first and second sub-line patterns MS1 and MS2. However, embodiments are not limited thereto.

The plurality of conductive pattern layers M1 to M3, M5, M7, and M8 (see FIG. 4A) may have a vertical structure in which the plurality of conductive pattern layers M1 to M3, M5, M7, and M8 are electrically connected to each other via the via plugs VP1 and VP2. That is, the via plugs VP1 and VP2 may be formed between the plurality of first sub-line patterns MS1 at one level and those at another level and between the plurality of second sub-line patterns MS2 at one level and those at another level. On the other hand, the contact plug CP may be formed to directly contact only the first and second line patterns ML1 and ML2 located at the intermediate level Lv.5.

When the contact layers CL are located between the plurality of conductive pattern layers M1 to M3, M5, M7, and M8 (see FIG. 4A), the second via plug VP2 providing a connection between conductive pattern layers M3, M5, and M7 facing the contact layers CL may have a greater height than the first via plug VP1 providing a connection between other conductive pattern layers M1 to M3, M7, and M8.

That is, since no conductive pattern layer is located at the levels Lv.4 and Lv.6 at which the contact layers CL are located, the second via plug VP2 providing a connection between conductive pattern layers M3, M5, and M7 may have a height in the third direction (Z direction), which is further increased by the height of the conductive pattern layer.

In addition, the contact plug CP may be located over or under each of the contact layers CL. The first contact pattern and the second contact pattern may be respectively located at different levels Lv.6 and Lv.4. This will be described below in detail.

Figure 5:
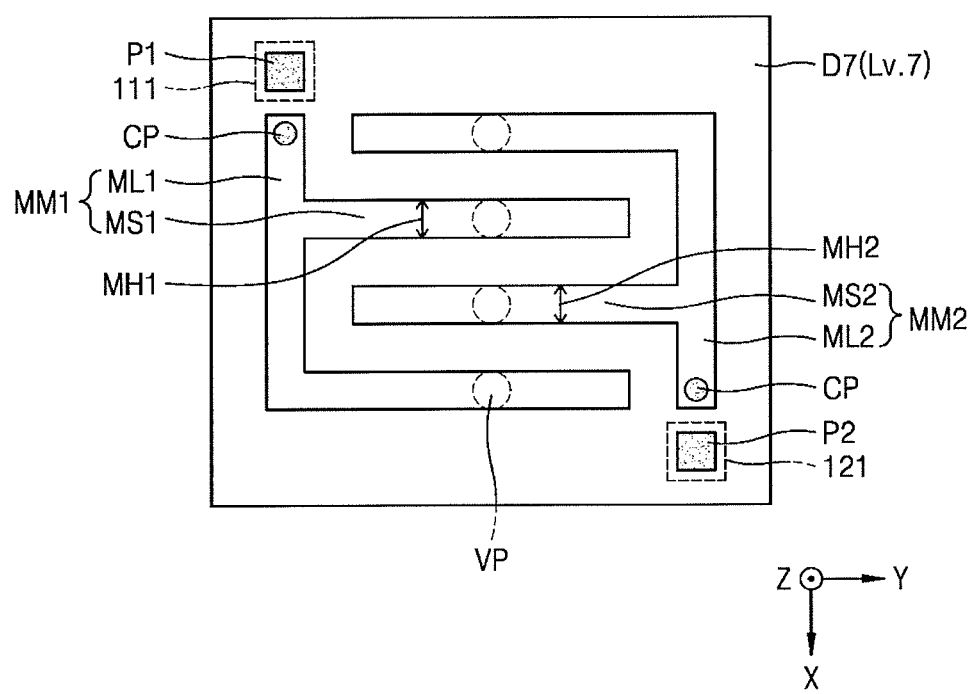
FIG. 5 illustrates a schematic plan view of a capacitor structure according to an embodiment.

FIG. 5 is a schematic plan view illustrating a capacitor structure according to an embodiment.

Referring to FIG. 5, each of the plurality of conductive pattern layers M1 to M7 (see FIG. 1A) may include a first conductive pattern MM1 electrically connected to the electrode pad 111, and a second conductive pattern MM2 electrically isolated from the first conductive pattern MM1 and electrically connected to the ground pad 121.

Each of the first conductive pattern MM1 and the second conductive pattern MM2 may have a comb structure, and may be arranged in the first direction (X direction) and the second direction (Y direction). The first conductive pattern MM1 includes the first line pattern ML1 and the plurality of first sub-line patterns MS1 branching off from the first line pattern ML1, and the second conductive pattern MM2 includes the second line pattern ML2 and the plurality of second sub-line patterns MS2 branching off from the second line pattern ML2.

The first and second sub-line patterns MS1 and MS2 extend along the second direction (Y direction) at the same level (for example, Lv.7 of FIG. 1A) as a dielectric layer D7.

In addition, the first and second sub-line patterns MS1 and MS2 are alternately arranged at the same level as the dielectric layer D7 while maintaining a certain separation distance therebetween along the first direction (X direction).

The first and second sub-line patterns MS1 and MS2 may have various shapes. For example, the first and second sub-line patterns MS1 and MS2 may substantially have bar shapes. In some embodiments, a width MH1 of each of the first sub-line patterns MS1 may be substantially equal to a width MH2 of each of the second sub-line patterns MS2.

The first sub-line patterns MS1 may be electrically connected to each other by the first line pattern ML1 connected to ends thereof. Here, the first line pattern ML1 and the first sub-line patterns MS1 may be formed by a single process. Alternatively, the first line pattern ML1 and the first sub-line patterns MS1 may be formed by different processes from each other.

The second sub-line patterns MS2 may be electrically connected to each other by the second line pattern ML2 connected to ends thereof. Here, the second line pattern ML2 and the second sub-line patterns MS2 may be formed by a single process. Alternatively, the second line pattern ML2 and the second sub-line patterns MS2 may be formed by different processes from each other.

The first sub-line patterns MS1 are electrically insulated from the second sub-line patterns MS2. In other words, the first sub-line patterns MS1 electrically connected to each other form one electrical group, and the second sub-line patterns MS2 form electrically connected to each other form another electrical group. In addition, a dielectric material fills spaces between the first and second sub-line patterns MS1 and MS2. Thus, the dielectric layer D7, the first sub-line patterns MS1, and the second sub-line patterns MS2 horizontally constitute a capacitor.

The via plug VP penetrating the dielectric layer D7 is formed. Specifically, the via plug VP penetrates portions of the dielectric layer D7, in which the first and second sub-line patterns MS1 and MS2 at one level overlap those at another level, and electrically connect the first and second sub-line patterns MS1 and MS2 at the one level to those at the other level.

The contact plug CP is formed on the first line pattern ML1 and the second line pattern ML2. The first line pattern ML1 is electrically insulated from the second line pattern ML2. In other words, first line patterns ML1 electrically connected to each other form one electrical group, and second line patterns ML2 electrically connected to each other form another electrical group.

The posts P1 and P2 are located outside the capacitor structure 10 (see FIG. 1A) to be respectively electrically connected to the electrode pad 111 and the ground pad 121, e.g., the posts P1 and P2 may be part of the capacitor structure 10 and extend through the interlayer dielectrics D1 to D8 while being external with respect to the plurality of metal wiring lines M1 to M7 (see FIG. 1A). The electrode pad 111 may directly contact a first post P1, and the ground pad 121 may directly contact a second post P2. The height of each of the posts P1 and P2 in the third direction (Z direction) may vary depending upon the level at which the contact layer CL (see FIG. 1A) is formed.

Figure 6A:
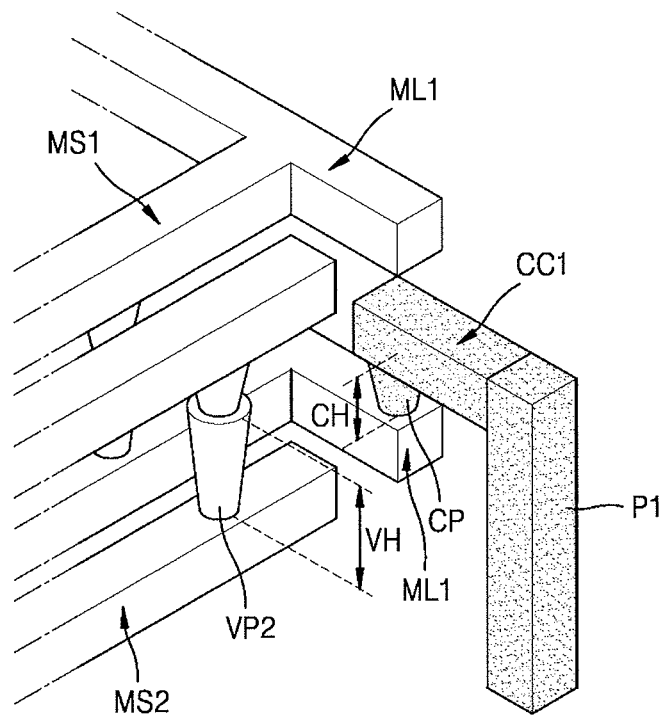
FIGS. 6A and 6B illustrate diagrams of a location of a contact plug of a capacitor structure according to an embodiment.
Figure 6B:
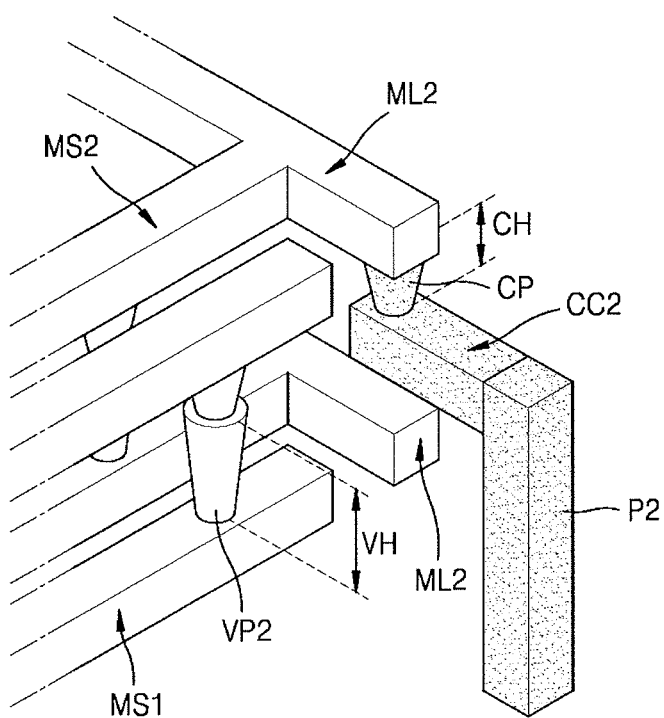

FIGS. 6A and 6B are conceptual diagrams illustrating a location of a contact plug of a capacitor structure according to an embodiment.

Referring to FIGS. 6A and 6B, the second via plug V2 connecting the first and second sub-line patterns MS1 and MS2 at one level to those at another level, and the contact plug CP connecting the first and second line patterns ML1 and ML2 to a contact layer are shown.

A plurality of conductive pattern layers is electrically connected to the contact layer via the contact plug CP. Each of the plurality of conductive pattern layers includes the first line pattern ML1 and the second line pattern ML2. The contact layer may include a first contact pattern CC1 electrically connected to the first line pattern ML1 and a second contact pattern CC2 electrically connected to the second line pattern ML2. The first contact pattern CC1 and the first line pattern ML1 may be located to be vertically aligned with each other, and the second contact pattern CC2 and the second line pattern ML2 may be located to be vertically aligned with each other.

The contact plug CP may be located under the first contact pattern CC1 as shown in FIG. 6A, or may be located over the second contact pattern CC2 as shown in FIG. 6B. That is, the contact plug CP may be located over or under the contact layer, and this may be selected as needed.

As shown, when the contact layer is located between the conductive pattern layers, a height VH of the second via plug VP2 connecting the conductive pattern layers facing the contact layer may be greater than a height CH of the contact plug CP. That is, since no conductive pattern layer is located at the level at which the contact layer is located, the second via plug VP2 connecting the conductive pattern layers may have a height vertically further increased by the height of a conductive pattern layer.

Figure 7:
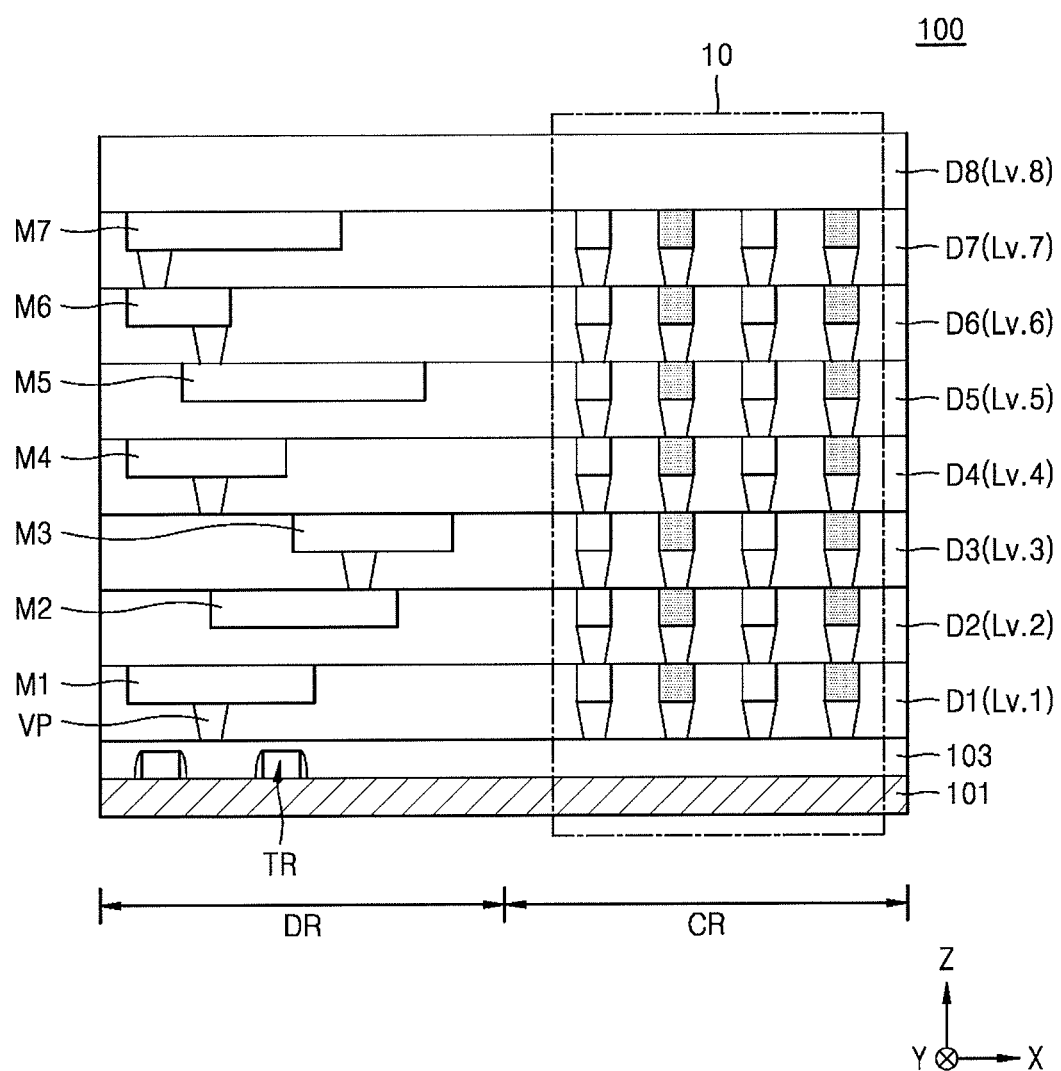
FIG. 7 illustrates a schematic cross-sectional view of a semiconductor device according to an embodiment.

FIG. 7 is a schematic cross-sectional view illustrating a semiconductor device according to an embodiment.

Referring to FIG. 7, the semiconductor device 100 including a device region DR and a capacitor region CR is shown. A transistor TR may be formed in the device region DR on the substrate 101, and there may be the via plug VP and a plurality of metal wiring lines M1 to M7, which are electrically connected to the transistor TR. In addition, the via plug VP and the metal wiring lines M1 to M7 may be surrounded by interlayer dielectrics D1 to D8. The capacitor structure 10 may be present in the capacitor region CR on the substrate 101.

In addition, the electrode pad 111 (see FIG. 1A) and the ground pad 121 (see FIG. 1A) may be formed in the capacitor region CR on the substrate 101, and the posts P1 and P2 may be formed outside the capacitor structure 10. The posts P1 and P2 may directly contact and be electrically connected to the electrode pad 111 and the ground pad 121, respectively, as discussed previously with reference to FIG. 1A.

The substrate 101 may include a semiconductor substrate. In some embodiments, the substrate 101 may include a semiconductor, e.g., silicon or germanium. In some other embodiments, the substrate 101 may include a compound semiconductor, e.g., silicon germanium, silicon carbide, gallium arsenide, indium arsenide, or indium phosphide. In some yet other embodiments, the substrate 101 may have a silicon-on-insulator (SOI) structure.

The inter-metal dielectric 103 and the interlayer dielectrics D1 to D8 may include, e.g., a silicon oxide film, a silicon nitride film, a silicon oxynitride film, a low-K material, an ultra low-K material, or combinations thereof, without being limited thereto.

The plurality of metal wiring lines M1 to M7 and the via plug VP may include a conductive material, e.g., titanium, titanium nitride, tantalum, tantalum nitride, tungsten, copper, aluminum, a mixture thereof, or a compound thereof, without being limited thereto.

In a VNCAP structure, a conductor and a dielectric, which constitute a capacitor, may be formed by the same processes at the same levels as the metal wiring lines M1 to M7 and the interlayer dielectrics D1 to D8 in the device region DR. Therefore, since a process of forming the VNCAP structure may be performed without additional photomasks, the VNCAP structure may be economically formed by a relatively simple process. Although FIG. 7 illustrates an example to which the capacitor structure 10 is applied, embodiments are not limited thereto.

The transistor TR may include a gate, a gate insulating film, and a source/drain region. Both sidewalls of the gate may be covered with a spacer, and the inter-metal dielectric 103 may be formed on the gate and the spacer.

As a result, according to the capacitor structure 10, 20, 30, or 40 (see FIGS. 1A to 4C) according to embodiments and the semiconductor device 100 including the capacitor structure 10, 20, 30, or 40, by applying design rules allowing the conductive pattern layers and the contact layer not to be located at the same level in the capacitor structure, problems such as breakdown of a capacitor, a short circuit, and current leakage through a dielectric are reduced, whereby the reliability of the capacitor structure 10, 20, 30, or 40 (see FIGS. 1A to 4C) and the productivity of the semiconductor device 100 including the capacitor structure 10, 20, 30, or 40 may be improved.

Figure 8:
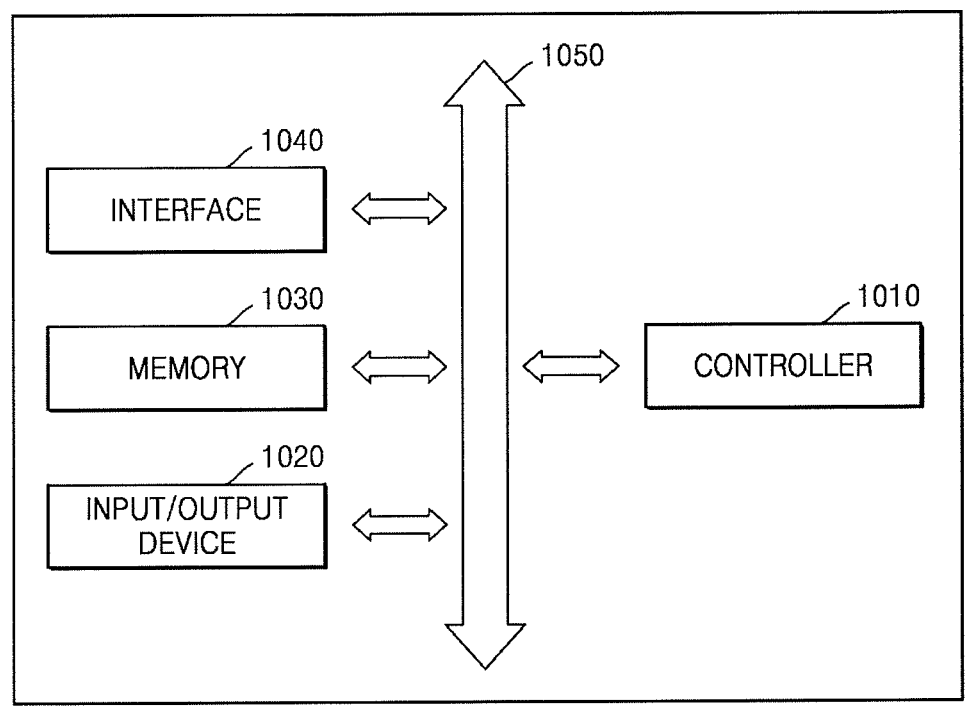
FIG. 8 illustrates a schematic diagram of an electronic system including a semiconductor device according to an embodiment.

FIG. 8 is a schematic diagram illustrating an electronic system including a semiconductor device according to an embodiment.

Referring to FIG. 8, an electronic system 1000 may include a controller 1010, an input/output device 1020, a memory 1030, and an interface 1040. The electronic system 1000 may be a mobile system or a system transmitting or receiving information. The mobile system may be a PDA, a portable computer, a web tablet, a wireless phone, a mobile phone, a digital music player, or a memory card.

The controller 1010 may function to execute programs and to control the electronic system 1000. The controller 1010 may include the semiconductor device 100 (see FIG. 7) according to an embodiment. The controller 1010 may be, for example, a microprocessor, a digital signal processor, a microcontroller, or a device that is similar thereto.

The input/output device 1020 may be used to input or output data of the electronic system 1000. The electronic system 1000 may be connected to devices external to the electronic system 1000, for example, a personal computer or a network, by using the input/output device 1020, and thus exchange data with the external devices. The input/output device 1020 may be, for example, a keypad, a keyboard, or a display.

The memory 1030 may store codes and/or data for operations of the controller 1010, and/or may store data processed by the controller 1010. The memory 1030 may include the semiconductor device 100 (see FIG. 7) according to an embodiment. The interface 1040 may be a data transmitting path between the electronic system 1000 and other devices external to the electronic system 1000. The controller 1010, the input/output device 1020, the memory 1030, and the interface 1040 may communicate with each other through a bus 1050.

For example, the electronic system 1000 may be used for mobile phones, MP3 players, navigation systems, portable multimedia players (PMPs), solid state disks (SSDs), or household appliances.

Figure 9:
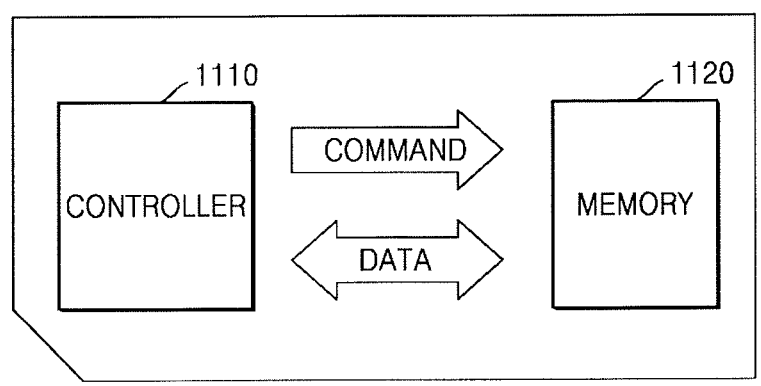
FIG. 9 illustrates a schematic diagram of a memory card including a semiconductor device according to an embodiment.

FIG. 9 is a schematic diagram illustrating a memory card including a semiconductor device according to an embodiment.

Referring to FIG. 9, a memory card 1100 may include a controller 1110 and a memory 1120, which are arranged to exchange electrical signals with each other. For example, if the controller 1110 gives a command to the memory 1120, the memory 1120 may transmit data. The memory 1120 or the controller 1110 may include the semiconductor device 100 (see FIG. 7) according to an embodiment. The memory card 1100 may include various cards, for example, a memory stick card, a smart media card (SM), a secure digital card (SD), a mini secure digital card (mini SD), or a multi-media card (MMC).

Figure 10:
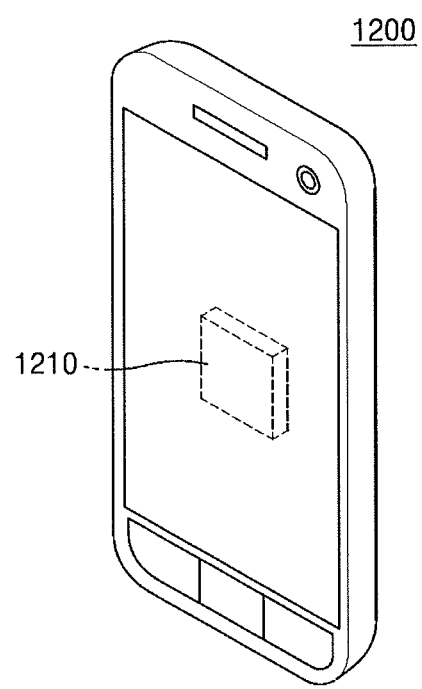
FIG. 10 illustrates a schematic perspective view of an electronic device including a semiconductor device according to an embodiment.

FIG. 10 is a schematic perspective view illustrating an electronic device including a semiconductor device according to an embodiment.

Referring to FIG. 10, an example, in which the electronic system 1000 of FIG. 8 is applied to a mobile phone 1200, is shown. The mobile phone 1200 may include a system-on-chip 1210. The system-on-chip 1210 may include the semiconductor device 100 (see FIG. 7) according to an embodiment. Since the mobile phone 1200 may include the system-on-chip 1210 in which a main functional block exhibiting relatively high performance may be arranged, the mobile phone 1200 may exhibit relatively high performance.

In addition, since the system-on-chip 1210 may exhibit relatively high performance even though having the same area as other general chips, the mobile phone 1200 may exhibit relatively high performance even while having a minimized size.

By way of summation and review, embodiments provide a capacitor structure, which allows reduction in process defects by designing a conductive pattern layer and a contact layer not at a same level in the capacitor structure, e.g., the conductive pattern layer and the contact layer may be in different vertical levels relatively to the substrate. As such, the resultant capacitor structure, as well as the semiconductor device including the capacitor structure, exhibit improved reliability and productivity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A capacitor structure, comprising:
   a substrate including an electrode pad and a ground pad;
   a plurality of dielectric layers on the substrate, the plurality of dielectric layers being at different levels on the substrate;
   a plurality of conductive pattern layers in at least two dielectric layers of the plurality of dielectric layers, the at least two dielectric layers of the plurality of dielectric layers being first dielectric layers;
   a plurality of via plugs connecting the plurality of conductive pattern layers to each other; and
   at least one contact layer in at least one second dielectric layer of the plurality of dielectric layers, the at least one second dielectric layer being different from the at least two first dielectric layers, and the at least one contact layer including first and second contact patterns, each of the first and second contact patterns being a single contact pattern electrically connecting the plurality of conductive pattern layers to the electrode pad and the ground pad, respectively.

2. The capacitor structure as claimed in claim 1, wherein the plurality of conductive pattern layers and the at least one contact layer are not at a same level relative to the substrate.

3. The capacitor structure as claimed in claim 1, wherein the at least one contact layer is among the plurality of conductive pattern layers, a via plug connecting two conductive pattern layers facing the at least one contact layer having a greater height than a via plug connecting other conductive pattern layers to each other.

4. The capacitor structure as claimed in claim 1, wherein the plurality of conductive pattern layers are electrically connected to the at least one contact layer via a contact plug perpendicular to a top surface of the substrate, the contact plug having a non-overlapping relationship with the plurality of via plugs.

5. The capacitor structure as claimed in claim 4, wherein the contact plug is over or under the at least one contact layer.

6. The capacitor structure as claimed in claim 4, wherein the at least one contact layer is among the plurality of conductive pattern layers, a via plug connecting two conductive pattern layers facing the at least one contact layer having a greater height than the contact plug.

7. The capacitor structure as claimed in claim 1, wherein the at least one contact layer includes:
the first contact pattern electrically connected to the electrode pad; and
the second contact pattern electrically isolated from the first contact pattern and electrically connected to the ground pad.

8. The capacitor structure as claimed in claim 7, wherein the first contact pattern and the second contact pattern are in a same second dielectric layer of the plurality of dielectric layers.

9. The capacitor structure as claimed in claim 7, wherein the first contact pattern and the second contact pattern are in different second dielectric layers of the plurality of dielectric layers, the different second dielectric layers being at different levels relatively to the substrate.

10. The capacitor structure as claimed in claim 1, wherein each of the plurality of conductive pattern layers includes:
a first conductive pattern electrically connected to the electrode pad; and
a second conductive pattern electrically isolated from the first conductive pattern and electrically connected to the ground pad.

11. A capacitor structure, comprising:
a substrate including an electrode pad and a ground pad;
a plurality of conductive pattern layers on the substrate, the plurality of conductive pattern layers being at different levels on the substrate;
a via plug connecting the plurality of conductive pattern layers to each other;
a dielectric surrounding the plurality of conductive pattern layers and the via plug; and
at least one contact layer at a different level than the plurality of conductive pattern layers, the at least one contact layer electrically connecting the plurality of conductive pattern layers to the electrode pad and the ground pad,
wherein the at least one contact layer includes:
a first contact pattern electrically connected to the electrode pad, and
a second contact pattern electrically isolated from the first contact pattern and electrically connected to the ground pad.

12. The capacitor structure as claimed in claim 11, wherein the plurality of conductive pattern layers are respectively at first to N-th levels (where N is a natural number of 2 or more), and the at least one contact layer is at an N+1-th level.

13. The capacitor structure as claimed in claim 11, wherein the plurality of conductive pattern layers are respectively at second to N-th levels (where N is a natural number of 3 or more), and the at least one contact layer is at a first level.

14. The capacitor structure as claimed in claim 11, wherein the plurality of conductive pattern layers are respectively at first to N-th levels (where N is a natural number of 2 or more), except at a K-th level (where K is one of natural numbers ranging from 2 to N−1), and the at least one contact layer is at the K-th level.

15. The capacitor structure as claimed in claim 11, wherein the plurality of conductive pattern layers are respectively at first to N-th levels (where N is a natural number of 2 or more), except at K-th levels (where K refers to two of natural numbers ranging from 2 to N−1), and the at least one contact layer is located at the K-th levels.

16. A semiconductor device, comprising:
a substrate including an electrode pad and a ground pad;
a capacitor structure on the substrate; and
a post electrically connected to the electrode pad and to the ground pad, the post being outside the capacitor structure,
wherein the capacitor structure includes:
a plurality of conductive pattern layers respectively at different levels,
a via plug connecting the plurality of conductive pattern layers to each other,
a dielectric surrounding the plurality of conductive pattern layers and the via plug,
at least one contact layer at a level different than those of the plurality of conductive pattern layers, the at least one contact layer directly contacting the post, and the plurality of conductive pattern layers being electrically connected to the post without directly contacting the post, and
a contact plug electrically connecting the plurality of conductive pattern layers to the contact layer and located over or under the at least one contact layer.

17. The semiconductor device as claimed in claim 16, wherein the at least one contact layer overlaps vertically an adjacent conductive pattern layer of the plurality of conductive pattern layers only at an edge of the adjacent conductive pattern layer that includes the contact plug.

18. The semiconductor device as claimed in claim 16, wherein the contact plug is perpendicular to a top surface of the substrate, at least one of the plurality of conductive pattern layers directly contacting the contact plug.

19. The semiconductor device as claimed in claim 16, wherein the post is perpendicular to a top surface of the substrate, the post including:
a first post electrically connected to the electrode pad; and
a second post electrically connected to the ground pad.

20. The semiconductor device as claimed in claim 16, wherein the capacitor structure is a vertical natural capacitor (VNCAP) structure.

* * * * *